(12) United States Patent
Sekine et al.

(10) Patent No.: US 11,651,958 B2
(45) Date of Patent: May 16, 2023

(54) TWO-DIMENSIONAL MATERIAL DEVICE AND METHOD FOR MANUFACTURING SAME

(71) Applicant: Nippon Telegraph and Telephone Corporation, Tokyo (JP)

(72) Inventors: Yoshiaki Sekine, Tokyo (JP); Yoshitaka Taniyasu, Tokyo (JP); Hiroki Hibino, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 64 days.

(21) Appl. No.: 16/973,386

(22) PCT Filed: May 22, 2019

(86) PCT No.: PCT/JP2019/020253
§ 371 (c)(1),
(2) Date: Dec. 8, 2020

(87) PCT Pub. No.: WO2019/244548
PCT Pub. Date: Dec. 26, 2019

(65) Prior Publication Data
US 2021/0210347 A1 Jul. 8, 2021

(30) Foreign Application Priority Data
Jun. 18, 2018 (JP) .............................. JP2018-115147

(51) Int. Cl.
*H01L 21/02* (2006.01)
*H01L 29/66* (2006.01)
*H01L 29/76* (2006.01)
*C23C 16/26* (2006.01)
*C23C 16/34* (2006.01)
*C30B 23/02* (2006.01)
*C30B 29/40* (2006.01)
*H01L 29/16* (2006.01)

(52) U.S. Cl.
CPC ........ *H01L 21/02527* (2013.01); *C23C 16/26* (2013.01); *C23C 16/342* (2013.01);
(Continued)

(58) Field of Classification Search
CPC combination set(s) only.
See application file for complete search history.

(56) References Cited

U.S. PATENT DOCUMENTS

2007/0187694 A1 8/2007 Pfeiffer
2010/0051960 A1* 3/2010 Chen ................. H01L 29/66742
438/105

(Continued)

FOREIGN PATENT DOCUMENTS

JP     2009527127 A     7/2009

OTHER PUBLICATIONS

Precise control of epitaxy of graphene by microfabricating SiC substrate at https://doi.org/10.1063/1.4740271, H.Fukidome, Jul. 2012, Applied Physics Letter 101, 041605, all pages. (Year: 2012).*

(Continued)

Primary Examiner — Moin M Rahman
Assistant Examiner — Mohammad A Rahman
(74) Attorney, Agent, or Firm — Slater Matsil, LLP

(57) ABSTRACT

By widening a terrace on a crystal surface on a bottom face of a recess by step flow caused by heating, a flat face is formed on the bottom face of the recess, a two-dimensional material layer made of a two-dimensional material is formed on the formed flat face, and then a device made of the two-dimensional material layer is produced.

13 Claims, 6 Drawing Sheets

(52) U.S. Cl.
CPC ............ *C30B 23/025* (2013.01); *C30B 29/40* (2013.01); *H01L 21/0243* (2013.01); *H01L 21/0254* (2013.01); *H01L 21/0262* (2013.01); *H01L 21/02378* (2013.01); *H01L 21/02568* (2013.01); *H01L 21/02631* (2013.01); *H01L 29/1606* (2013.01); *H01L 29/66045* (2013.01); *H01L 29/7606* (2013.01)

(56) References Cited

U.S. PATENT DOCUMENTS

2010/0314626 A1* 12/2010 Harada ............... H01L 29/1608 257/77

2019/0136411 A1* 5/2019 Kaneko ............ H01L 21/02433

OTHER PUBLICATIONS

Fukidome et al., "Precise control of epitaxy of graphene by microfabricating SiC substrate," Applied Physics Letters, vol. 101, 2012, 4 pages.

Ji, et al, "Atomic-scale transport in epitaxial graphene," Nature Materials, vol. 11, Feb. 2012, pp. 114-119.

Sekine et al., "Graphene Growth on SiC Single Terrace," The 65th Japan Society of Applied Physics Spring Academic Lecture Proceedings, Waseda University Nishi Waseda Campus, Mar. 5, 2018, pp. 172.

* cited by examiner

[Fig. 1A]
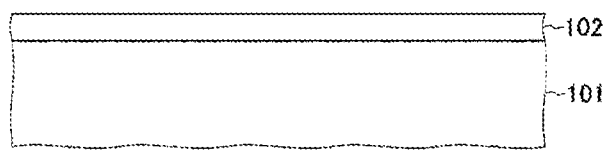
[Fig. 1B]
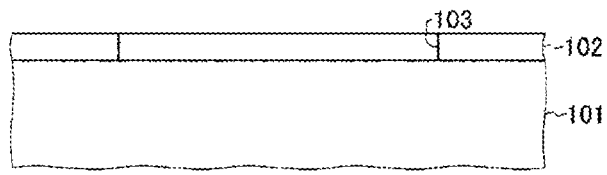
[Fig. 1C]
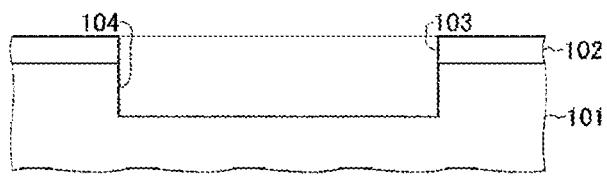
[Fig. 1D]
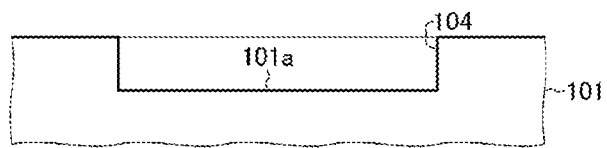

[Fig. 2A]
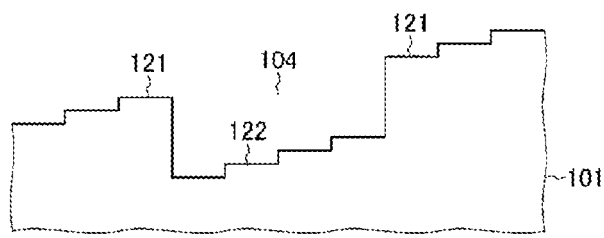
[Fig. 2B]
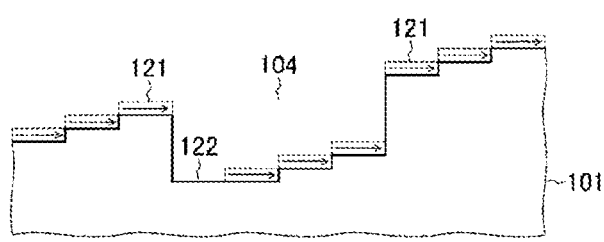
[Fig. 2C]
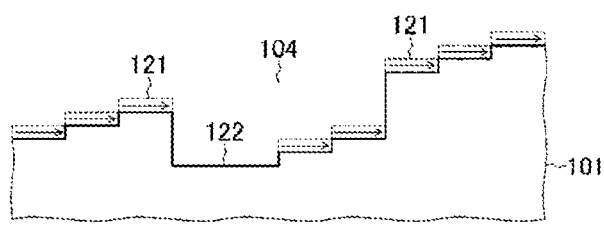
[Fig. 2D]
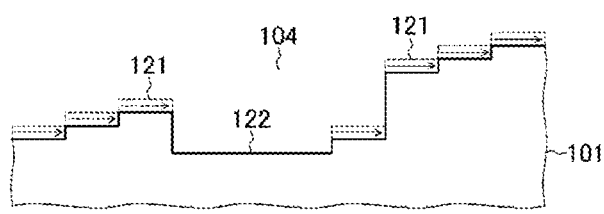

[Fig. 3]
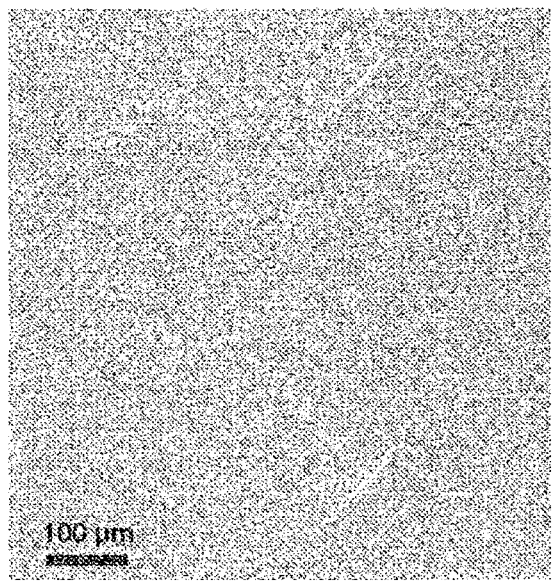
[Fig. 4]
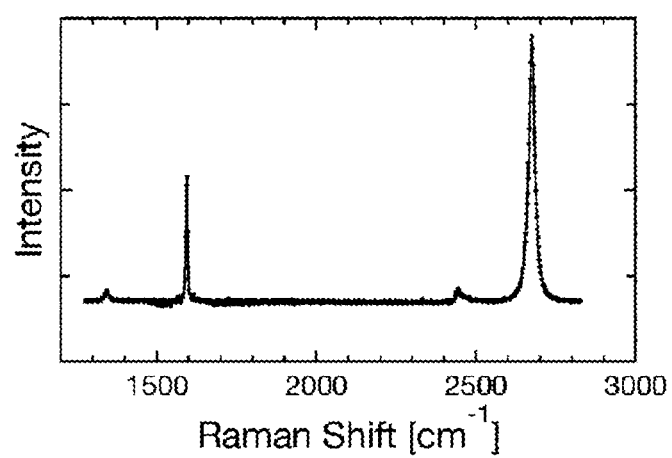

[Fig. 5A]
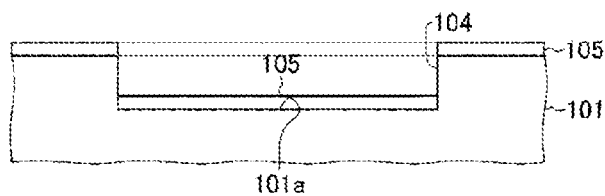
[Fig. 5B]
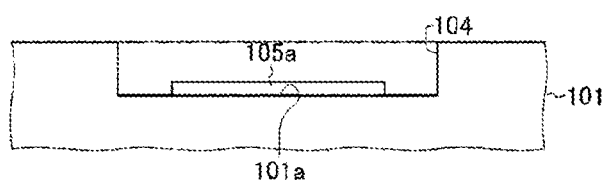
[Fig. 5C]
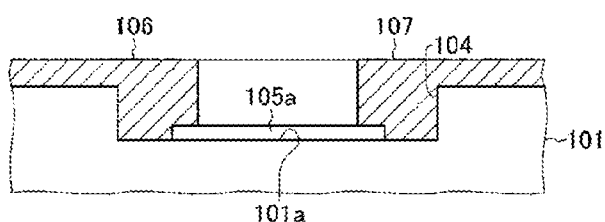
[Fig. 5D]
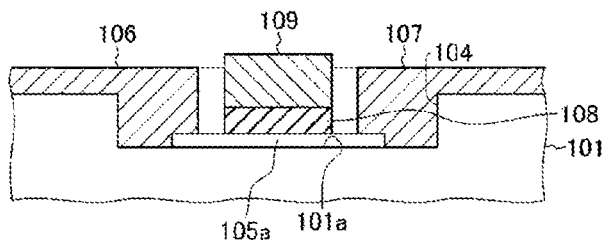

[Fig. 6]
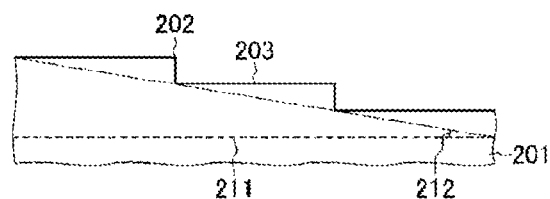

[Fig. 7A]
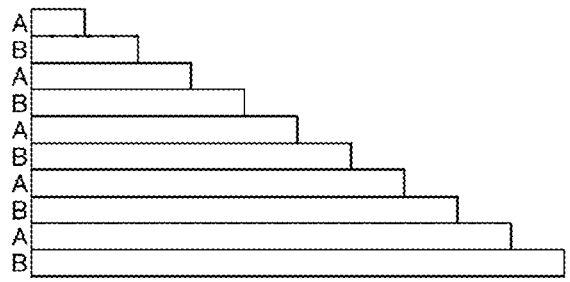
[Fig. 7B]
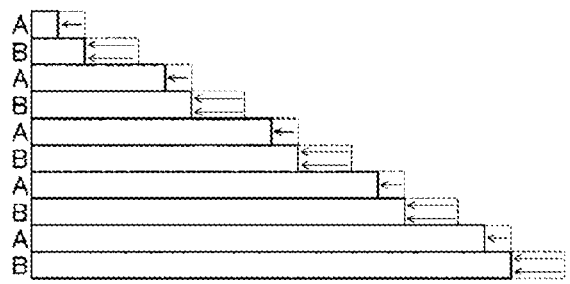
[Fig. 7C]
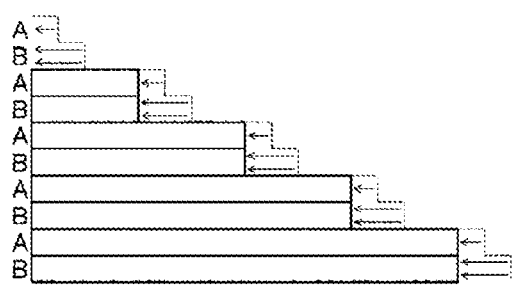

TWO-DIMENSIONAL MATERIAL DEVICE AND METHOD FOR MANUFACTURING SAME

CROSS-REFERENCE TO RELATED APPLICATIONS

This application is a national phase entry of PCT Application No. PCT/JP2019/020253, filed on May 22, 2019, which claims priority to Japanese Application No. 2018-115147, filed on Jun. 18, 2018, which applications are hereby incorporated herein by reference.

TECHNICAL FIELD

The present invention relates to a two-dimensional material device formed from a two-dimensional material such as graphene, and a method for producing the same.

BACKGROUND

Two-dimensional materials having a thickness on the atomic layer level, such as graphene, hexagonal boron nitride (h-BN), transition metal die chalcogenide (MX2; M is a transition metal, X is a Group 16 chalcogenide such as sulfur, selenium, or tellurium), are receiving attention. These two-dimensional materials exhibit various electrically, optically, mechanically, and chemically excellent properties, and are expected to be applied to heterojunction devices and the like.

However, since the two-dimensional materials are very thin, their properties are susceptible to influence of the irregularities on a substrate, and it is difficult to achieve a device with good properties. As shown in FIG. 6, the surface of a commercially available substrate 201 is inclined from a lattice plane 211 of a crystal material at an inclination angle 212, and therefore is not flat on the atomic level, and an atomic step 202 and a terrace 203 of a sub-micrometer size are present thereon. The properties of an atomic-layer-thick, two-dimensional material are strongly affected by the atomic step 202. Taking graphene grown on silicon carbide (SiC) substrate as an example, it is known that the electric properties degrade in a region where the graphene extends over an atomic step of SiC (see NPL 1).

On the other hand, a terrace is a stable crystal face, and is an atomically flat face. However, it is difficult to produce a device on a small terrace having a width of sub-micrometer. The terrace width depends on the inclination angle between the surface of the substrate and the crystal face. For example, in the case of SiC, when the inclination angle from the main surface is 0.1° from the (0001) plane and the step height is 1 nm, the terrace width is 0.57 µm.

For a single crystal material, as will be described below, a wider terrace can be formed by step bunching caused by high-temperature treatment.

In the case of SiC, a layer A and a layer B having different polymorphisms are stacked alternately as shown in FIG. 7A, and the speeds of step flow caused by high-temperature treatment are different between the layer A and the layer B. For example, the step flow speed VB of the layer B is twice the step flow speed VA of the layer A. Accordingly, by performing high-temperature treatment, a terrace on the layer B that is formed laterally to the atomic step of the layer A gradually decreases as shown in FIGS. 7A and 7B. Thereafter, as shown in FIG. 7C, when the atomic step of the layer A overlaps the atomic step of the layer B, the terrace on the layer A that is formed laterally to the atomic step of the layer B becomes wider.

CITATION LIST

Non Patent Literature

NPL 1—S. H. Ji et al., "Atomic-scale transport in epitaxial graphene", NATURE Materials, vol. 11, pp. 114-119, 2012.

SUMMARY

Technical Problem

However, with the above-described technique, it is not possible to widen the desired terrace located at a specific place. A two-dimensional material for providing a device with good properties needs to be disposed so as not to extend over an atomic step, and it is not possible to produce a device at a given location on a substrate by simply widening the terrace.

At present, a peeling and transfer method is available as a technique for producing a two-dimensional material on a flat face. In this technique, h-BN is used for a flat face, and a two-dimensional material is formed thereon. First, a thin-film h-BN that has been peeled from a bulk crystal of h-BN is transferred to a substrate such as silicon Si. On the h-BN thin film disposed on the silicon substrate in this manner, an atomic-layer-thick, two-dimensional material that has been peeled from a bulk crystal of a two-dimensional material is transferred. According to this technique, it is possible to produce an atomically flat two-dimensional material of high quality.

However, a two-dimensional material layer that can be produced has a size of about a micrometer, and it is difficult to achieve an area increase, which is essential for device applications. As such, conventional techniques are problematic in that a two-dimensional material layer having a large area required for device applications cannot be formed at a given location on a substrate, and that a device cannot be formed by a two-dimensional material layer having a large area formed at a given location on a substrate.

Embodiments of the present invention have been made in order to solve the above-described problems, and an object of the invention is to form a device by a large-area, two-dimensional material layer formed at a given location on a substrate.

Means for Solving the Problem

A two-dimensional material device according to embodiments of the present invention includes: a first step of forming a recess in a surface of a substrate made of a crystal material; a second step of forming a flat face by widening a terrace on a crystal surface on a bottom face of the recess by step flow caused by heating; a third step of forming a two-dimensional material layer made of a two-dimensional material on the flat face; and a fourth step of producing a device made of the two-dimensional material layer.

In the above-described method for producing a two-dimensional material device, in the second step, the flat face is formed over an entire region of the bottom face of the recess by widening the terrace over the entire region of the bottom face of the recess by step flow.

In the above-described method for producing a two-dimensional material device, the substrate is formed from SiC, and the two-dimensional material layer is graphene formed, by heating, on a bottom face of the recess that is made of SiC.

A two-dimensional material device according to embodiments of the present invention includes: a recess formed on a surface of a substrate made of a crystal material; a flat face formed on a bottom face of the recess; a two-dimensional material layer that is made of a two-dimensional material and is formed on the flat face; and a device made of the two-dimensional material layer, wherein the flat face is a face formed by widening a terrace on a crystal surface on the bottom face of the recess by step flow caused by heating.

In the above-described two-dimensional material device, the flat face is a face formed over an entire region of the bottom face of the recess by widening the terrace over the entire region of the bottom face of the recess by step flow.

In the above-described two-dimensional material device, the substrate is formed from SiC, and the two-dimensional material layer is formed from graphene.

Effects of the Invention

As described above, according to embodiments of the present invention, a flat face is formed by widening, by step flow, a terrace on a crystal surface on a bottom face of a recess formed in a surface of a substrate made of a crystal material, and a two-dimensional material layer is formed. Accordingly, it is possible to achieve the superior effect that a device can be formed by a large-area, two-dimensional material layer formed at a given location on the substrate.

BRIEF DESCRIPTION OF THE DRAWINGS

FIG. 1A is a cross-sectional view showing a state of an intermediate process, illustrating a method for producing a two-dimensional material device according to an embodiment of the present invention.

FIG. 1B is a cross-sectional view showing a state of an intermediate process, illustrating a method for producing a two-dimensional material device according to an embodiment of the present invention.

FIG. 1C is a cross-sectional view showing a state of an intermediate process, illustrating a method for producing a two-dimensional material device according to an embodiment of the present invention.

FIG. 1D is a cross-sectional view showing a state of an intermediate process, illustrating a method for producing a two-dimensional material device according to an embodiment of the present invention.

FIG. 2A is a cross-sectional view schematically showing a more detailed state of an intermediate process in a method for producing a two-dimensional material device according to an embodiment of the present invention.

FIG. 2B is a cross-sectional view schematically showing a more detailed state of an intermediate process in a method for producing a two-dimensional material device according to an embodiment of the present invention.

FIG. 2C is a cross-sectional view schematically showing a more detailed state of an intermediate process in a method for producing a two-dimensional material device according to an embodiment of the present invention.

FIG. 2D is a cross-sectional view schematically showing a more detailed state of an intermediate process in a method for producing a two-dimensional material device according to an embodiment of the present invention.

FIG. 3 is a photograph showing a differential interference microscope image of graphene formed in a recess of a SiC substrate produced by the production method according to the embodiment.

FIG. 4 is a characteristic diagram showing a scattering spectroscopy spectrum of graphene formed in a recess of a SiC substrate produced by the production method according to the embodiment.

FIG. 5A is a cross-sectional view showing a state of an intermediate process, illustrating a method for producing a two-dimensional material device according to an embodiment of the present invention.

FIG. 5B is a cross-sectional view showing a state of an intermediate process, illustrating a method for producing a two-dimensional material device according to an embodiment of the present invention.

FIG. 5C is a cross-sectional view showing a state of an intermediate process, illustrating a method for producing a two-dimensional material device according to an embodiment of the present invention.

FIG. 5D is a cross-sectional view showing a state of an intermediate process, illustrating a method for producing a two-dimensional material device according to an embodiment of the present invention.

FIG. 6 is a cross-sectional view showing a surface state of a substrate 201 made of a crystal material.

FIG. 7A is an explanatory diagram for illustrating terrace expansion by step bunching.

FIG. 7B is an explanatory diagram for illustrating terrace expansion by step bunching.

FIG. 7C is an explanatory diagram for illustrating terrace expansion by step bunching.

DETAILED DESCRIPTION OF ILLUSTRATIVE EMBODIMENTS

Hereinafter, a method for producing a two-dimensional material device according to an embodiment of the present invention will be described with reference to FIGS. 1A to 1D.

First, as shown in FIG. 1A, a photoresist is applied onto a substrate 101 made of a crystal material, to form a resist layer 102. The substrate 101 is formed from SiC having a (0001) plane as a main surface, for example. As the photoresist, a positive photoresist S1813 (manufactured by Rohm and Haas) may be used, for example.

Next, using a known photolithography technique, a predetermined pattern is exposed on the resist layer 102 to form thereon a latent image having a rectangular shape measuring 50 to 100 μm per side in a plan view, followed by development treatment using an alkaline developer, thus forming an opening 103 in the resist layer 102 as shown in FIG. 1B. The opening 103 is formed in a rectangular shape measuring 50 to 100 μm per side in a plan view.

Next, the substrate 101 is etched using, as a mask, the resist layer 102 having the opening 103 formed therein, thus forming a recess 104 in the surface of the substrate 101 as shown in FIG. 1C (first step). For example, the recess 104 may be formed by reactive ion etching using a reactive gas such as CF4.

Next, after the resist layer 102 has been removed, a terrace on the crystal surface on the bottom face of the recess 104 is widened by step flow caused by heating, thus forming a flat face 101a on the bottom face of the recess 104 as shown in FIG. 1D (second step). For example, the flat face 101a is formed over the entire region of the bottom face of the recess 104 by widening the terrace over the entire region of the bottom face of the recess 104 by step flow.

In the following, step flow will be described. First, as shown in FIG. 2A, forming the recess 104 results in a state in which terraces 121 are present on the surface of the substrate 101, and a terrace 122 is present on the bottom face of the recess 104. By performing heating in this state, the atomic steps are moved by step flow. In this step flow, the terrace 122 whose one end side on the bottom face of the recess 104 forms a wall of the recess 104 has no atomic step on the wall side, and therefore the atomic step on the other end side is moved. As a result, as shown in FIGS. 2B to 2D, the terrace 122 whose one end side on the bottom face of the recess 104 forms a wall of the recess 104 is widened by step flow caused by heating. Note that the depth of the recess 104 is gradually decreased by step flow.

Through the above-described process, a wide flat face 101a is formed on the bottom face of the recess 104. Thus, after the flat face 101a has been formed, a two-dimensional material layer (not shown) made of a two-dimensional material is formed on the flat face 101a (third step), and then a device (not shown) made of the two-dimensional material layer is formed (fourth step). For example, graphene formed on the bottom face (flat face 101a), which is made of SiC, of the recess 104 by heating may be used as the two-dimensional material layer.

According to the embodiment, the two-dimensional material layer formed on the flat face 101a can be formed without extending over any atomic step. In addition, the recess 104 can be formed at any given location on the substrate 101, as a result of which the two-dimensional material layer can be formed at any given location on the substrate 101.

Here, the depth of the recess 104 is set as appropriate according to the inclination angle of the surface of the substrate 101 from the lattice plane (crystal face), the width of a terrace to be produced, and the like. For example, if the depth of the recess 104 is insufficient, the depth of the recess is reduced by step flow, and therefore the shape of the recess is impaired. The inclination angle of a commonly sold SiC substrate is about 0.1°. In this case, when the depth of the recess 104 is set to 100 nm, a terrace (flat face 101a) of 50 µm can be produced.

For example, after the recess 104 has been formed, the substrate 101 is heated to 1570° C. under a hydrogen atmosphere, whereby a flat face 101a constituted by an atomically flat terrace can be formed at the bottom of the recess 104 by step flow. Although the heating time depends on not only the heating temperature, but also the inclination angle or the azimuth of inclination of the surface of the substrate 101, a terrace (flat face 101a) of about 50 µm can be produced by heating for about 30 minutes.

With the above-described production method according to the embodiment, it is possible to obtain a two-dimensional material device including a recess 104 formed on a surface of a substrate 101 made of a crystal material, a flat face formed on a bottom face of the recess 104, a two-dimensional material layer that is made of a two-dimensional material and is formed on the flat face, and a device made of the two-dimensional material layer. The flat face is a face formed by widening the terrace on the crystal surface on the bottom face of the recess 104 by step flow caused by heating.

Here, the substrate 101 can be formed of any crystal material as long as the crystal material has a stable crystal face and causes step flow, and embodiments of the present invention have a wide range of applications. The substrate 101 can be formed of a material, not limited to SiC, but a single crystal silicon, for example.

Next, the above-described two-dimensional material layer may be formed from graphene, h-BN, MX2, or the like. These can be grown to have a large area on a metal substrate by chemical vapor deposition (CVD). Examples of MX2 include MoS2 and WSe2. The two-dimensional material layer maybe formed by transferring, to the flat face 101a of the recess 104, a two-dimensional material that has been grown to have a large area in this manner. When the size of the recess 104 in a plan view is set to several tens of micrometers and the depth of the recess 104 to several tens of nanometers, transferring the two-dimensional material will not result in a shape like a suspension bridge, and a state in which the two-dimensional material layer is formed on the flat face 101a can be attained.

When the substrate 101 is formed from SiC, as described above, a two-dimensional material layer made of graphene can be formed by growing graphene on the flat face 101a using SiC surface thermal decomposition, which will be described next.

Here, a common production method of graphene using SiC surface thermal decomposition will be described. When a SiC substrate having a (0001) plane as a main surface is heated, Si is selectively eliminated on the substrate surface, and the remaining carbon (C) forms honeycomb structures on the surface of the SiC substrate. A first formed honeycomb structure is a buffer layer serving as an insulator in which a portion of C is bonded to Si of the SiC substrate. Thereafter, through further elimination of Si, a second buffer layer is formed below the first buffer layer. As a result of the formation of the second buffer layer, the first buffer layer is separated from the SiC substrate, thus forming graphene. This is a common graphene growth method using SiC surface thermal decomposition.

Graphene can be formed from the buffer layer also by intercalating hydrogen or the like between the buffer layer and the SiC substrate to break the C—Si bonds. In the graphene growth using intercalation, only the buffer layer is grown on SiC, and it is therefore possible to make the growth temperature low. The low growth temperature is advantageous in retaining a flat terrace in the recess.

The following describes results of a test in which graphene was produced by the above-described hydrogen intercalation from the buffer layer. A recess was formed on a surface of a SiC substrate, followed by heating at 1570° C. for several minutes under an argon atmosphere, thus growing a buffer layer on the surface (including a bottom face of the recess) of the SiC substrate. Thereafter, hydrogen was intercalated between the formed buffer layer and the SiC substrate by performing heating at 700° C. under a hydrogen atmosphere, thus producing graphene.

FIG. 3 shows a differential interference microscope image obtained when observing a state of graphene produced using the above-described method. A flat terrace having a shape with a width of 50 µm and a length of 100 µm in a plan view and formed on the (entire region of) bottom of the recess can be observed. Except for the recess, the graphene has a normal step-terrace structure. It can be seen that a terrace with sides of several tens of micrometers can be formed at an arbitrarily designed location on the substrate.

Next, FIG. 4 shows a Raman scattering spectroscopy spectrum of the above-described graphene formed on the recess. A 2D peak characteristic of graphene can be observed at 2680 cm−1. The graphene quality can be evaluated based on the half width of the 2D peak. The 2D half width of the graphene grown on the flat terrace on the bottom face of the recess was 21 cm−1, and the half width of the graphene formed extending over an atomic step in a region other than the recess was 24 cm−1. The small 2D half width of the graphene grown on the flat terrace on the bottom face of the recess is comparable to that of a suspension bridge-like graphene, indicating that a high-quality graphene has been grown. Since the device performance is significantly affected by the quality of the two-dimensional material, it is possible to produce a high-performance device by using graphene formed on a flat face constituted by a widened terrace formed on a bottom portion of a recess.

When the substrate 101 is formed from SiC, the substrate 101 has high heat resistance, and thus a stable terrace structure can be maintained also at high temperatures. Accordingly, a two-dimensional material layer made of graphene can be formed by growing graphene using CVD. By growing h-BN or MX2 using CVD or molecular beam epitaxy (MBE), a two-dimensional material layer made of h-BN or MX2 can be formed on the flat face 101a.

A two-dimensional material can be directly grown on a substrate such as gallium nitride (GaN) or sapphire, not just SiC, while maintaining the state of the terrace in the recess also at high temperatures. As for the temperature at which the state of the terrace in the formed recess can be maintained, the step-flow temperature for forming the flat face 101a can be used as a reference. This temperature is about 1200° C. for Si, about 1400° C. for sapphire, about 1100° C. for GaN, and about 1600° C. for SiC.

On the other hand, the growth temperatures of the two-dimensional materials in the case of a SiC substrate are as follows. The temperature of SiC surface thermal decomposition and the growth temperatures by CVD for graphene are about 1600° C. The growth temperature by MBE and CVD for h-BN are 1000° C. The growth temperature by CVD for MoS2 is about 1100° C. The growth temperature by CVD for WSe2 is about 800° C. While the graphene growth temperature on SiC is comparable to the temperature for producing a terrace in the recess, the growth temperature is low for the other two-dimensional materials, so that the terrace structure in the recess can be maintained.

Next, a two-dimensional material device using a two-dimensional material layer made of graphene according to an embodiment will be described, taking a field-effect transistor as an example.

First, as shown in FIG. 5A, a graphene layer 105 is formed on a substrate 101 that is made of SiC and in which a recess 104 is formed. On a bottom face of the recess 104, a flat face 101a is formed by step flow caused by heating. Next, the graphene layer 105 is patterned using known lithography and etching techniques, thus forming a two-dimensional material layer 105a on the flat face 101a as shown in FIG. 5B. For the etching, dry etching with oxygen plasma may be used, for example.

Next, as shown in FIG. 5C, a source electrode 106 and a drain electrode 107 that are to be connected respectively to one end and the other end of the two-dimensional material layer 105a are formed. For example, a resist pattern having openings in regions in which the respective electrodes are to be formed is formed. Then, an adhesive layer such as titanium, chromium, nickel, or palladium is formed by vapor deposition, followed by vapor deposition of gold, to form an electrode metal layer. Thereafter, by removing (lifting off) the resist pattern to remove the portion of the electrode metal layer other than the portions thereof located in the regions in which the electrodes are to be formed, a source electrode 106 and a drain electrode 107 can be formed.

Next, as shown in FIG. 5D, a gate insulating layer 108 and a gate electrode 109 are formed on a portion of the two-dimensional material layer 105a that is located in a region sandwiched between the source electrode 106 and the drain electrode 107. For example, a resist pattern having an opening in a region in which a gate is to be formed is formed. Then, an insulating material such as alumina, yttrium oxide, or silicon oxide is vapor-deposited under an oxygen atmosphere, to form an insulating layer. Subsequently, an adhesive layer such as titanium, chromium, nickel, or palladium is formed by vapor deposition, followed by vapor deposition of gold, to form a gate metal layer.

Thereafter, by removing (lifting off) the resist pattern to remove the portions of the insulating layer and the gate metal layer gate other than the portions thereof located in the region in which the gate is to be formed, a gate insulating layer 108 and a gate electrode 109 can be formed. Through the above-described processes, a field-effect transistor (two-dimensional material device) in which the two-dimensional material layer 105a in the region sandwiched between the source electrode 106 and the drain electrode 107 serves as a channel can be obtained.

As described above, according to embodiments of the present invention, a flat face is formed by widening, by step flow, a terrace on a crystal surface on a bottom face of a recess formed in a surface of a substrate made of a crystal material, and a two-dimensional material layer is formed. Accordingly, a device can be formed by a larger-area, two-dimensional material layer formed at a given location on the substrate.

It should be noted that the present invention is not limited to the embodiments described above, and it is apparent that those skilled in the art can make many modifications and combinations within the technical idea of the present invention.

REFERENCE SIGNS LIST

101 Substrate
101a Flat face
102 Resist layer
103 Opening
104 Recess
105 Graphene layer
105a Two-dimensional material layer
106 Source electrode
107 Drain electrode
108 Gate insulating layer
109 Gate electrode

The invention claimed is:

1. A method for producing a two-dimensional material device, comprising:
   forming a recess in a surface of a substrate made of a crystal material;
   forming a flat face by widening a terrace on a crystal surface at a bottom of the recess by step flow caused by heating, wherein forming the recess in the surface of the substrate and forming the flat face by widening the terrace are performed by separate processes with different process conditions;
   forming a two-dimensional material layer made of a two-dimensional material on the flat face, wherein forming the two-dimensional material layer and forming the flat face are performed by separate processes with different process conditions; and
   producing a device comprising the two-dimensional material layer.

2. The method for producing the two-dimensional material device according to claim 1, wherein forming the flat face comprises forming the flat face over an entirety of the bottom of the recess by widening the terrace over the entirety of the bottom of the recess by step flow.

3. The method for producing the two-dimensional material device according to claim 1, wherein the substrate comprises SiC, wherein forming the two-dimensional material layer comprises heating SiC at a bottom of the recess, and wherein the two-dimensional material layer comprises graphene.

4. The method for producing the two-dimensional material device according to claim 3, wherein heating the SiC at the bottom of the recess comprises eliminating silicon from the SiC to form graphene.

5. The method for producing the two-dimensional material device according to claim 1, wherein forming the recess comprises forming a plurality of terraces at the bottom of the recess, wherein the terrace is one of the plurality of terraces.

6. The method for producing the two-dimensional material device according to claim 1, wherein widening the terrace comprises moving an atomic step of the terrace by heating, and wherein the atomic step is on an opposite side of the terrace as a sidewall of the recess.

7. The method for producing the two-dimensional material device according to claim 1, wherein the terrace abuts a sidewall of the recess prior to widening the terrace.

8. The method for producing the two-dimensional material device according to claim 1, wherein forming the two-dimensional material layer is performed at a lower temperature than forming the flat face are performed by separate processes.

9. The method for producing the two-dimensional material device according to claim 1, wherein a depth of the recess is selected according to an inclination angle of the surface of the substrate from a lattice plane of the crystal material.

10. A two-dimensional material device comprising:
   a recess on a surface of a substrate made of a crystal material;
   a flat face formed at a bottom of the recess;
   a two-dimensional material layer made of a two-dimensional material on the flat face; and
   a device comprising:
      the two-dimensional material layer;
      a source electrode extending from above the recess into the recess, the source electrode being disposed on a top surface and a first sidewall of the two-dimensional material layer, the source electrode extending from a top of the first sidewall of the two-dimensional material to a bottom of the first sidewall of the two-dimensional material; and
      a drain electrode extending from above the recess into the recess, the drain electrode being disposed on the top surface and a second sidewall of the two-dimensional material layer.

11. The two-dimensional material device of claim 10, wherein the flat face is formed by a terrace on a crystal surface at the bottom of the recess.

12. The two-dimensional material device according to claim 10, wherein the flat face is an entirety of the bottom of the recess.

13. The two-dimensional material device according to claim 10, wherein the substrate comprises SiC, and the two-dimensional material layer comprises graphene.

* * * * *